(12) United States Patent
Werner

(10) Patent No.: US 8,650,217 B2
(45) Date of Patent: Feb. 11, 2014

(54) COMPRESSION METHOD FOR A DATA TRANSFER THAT IS INDEPENDENT OF COMPUTER ARCHITECTURE AND/OR DECOMPRESSION METHOD FOR A DATA RECORD

(75) Inventor: Christian Werner, Salzgitter (DE)

(73) Assignee: Universitat Zu Lubeck, Lubeck (DE)

( * ) Notice: Subject to any disclaimer, the term of this patent is extended or adjusted under 35 U.S.C. 154(b) by 869 days.

(21) Appl. No.: 12/094,761

(22) PCT Filed: Nov. 21, 2006

(86) PCT No.: PCT/DE2006/002052
§ 371 (c)(1),
(2), (4) Date: Sep. 22, 2008

(87) PCT Pub. No.: WO2007/059746
PCT Pub. Date: May 31, 2007

(65) Prior Publication Data
US 2009/0193045 A1    Jul. 30, 2009

(30) Foreign Application Priority Data
Nov. 23, 2005   (DE) .......................... 10 2005 056 122

(51) Int. Cl.
*G06F 17/30* (2006.01)
(52) U.S. Cl.
USPC .................. 707/796; 707/101; 707/E17.044; 709/247; 715/234
(58) Field of Classification Search
None
See application file for complete search history.

(56) References Cited

U.S. PATENT DOCUMENTS

| 5,862,325 | A  | * | 1/1999  | Reed et al. ..................... 709/201 |
| 7,154,638 | B1 | * | 12/2006 | Lapstun et al. .............. 358/3.28 |
| 2003/0154444 | A1 |   | 8/2003  | Tozawa et al. ................ 715/513 |
| 2004/0117358 | A1 | * | 6/2004  | von Kaenel et al. ............. 707/3 |
| 2006/0155398 | A1 | * | 7/2006  | Hoffberg et al. ................ 700/86 |

FOREIGN PATENT DOCUMENTS

WO    01/27754    4/2001

OTHER PUBLICATIONS

Cheney, J., "Comprising XML with Multiplexed Hierarchical PPM Models," IEEE Computer Society Press, Los Alamitos, CA, Mar. 27, 2001, pp. 163-172.
Hariharan, S., et al., "Compressing XML Documents with Finite State Automata," Proceedings of the Tenth International Conference on Implementation and Application of Automata (CIAA 2005), pp. 285-296, 2005.

(Continued)

*Primary Examiner* — Shyue Jiunn Hwa
(74) *Attorney, Agent, or Firm* — Seed IP Law Group PLLC

(57)    ABSTRACT

A compression method for a data transfer that is independent of computer architecture and/or a decompression method for a data record that contains structural indicators and variable values are provided. The method includes the following steps: provision of a string automaton, which represents the structuring rules of the data record in a unit that compresses the original data record; input of the data record into the string automaton; generation of a second, shorter data record by the string automaton, the record containing the variable values of the first data record and control symbols that are specific to the string automaton equipment, the symbols representing a switch from an automaton condition to a sequence condition; and transmission of the second data record to a similar string automaton, which interprets the control symbols, whereby a copy of the original data record with an identical data structure is generated.

24 Claims, 4 Drawing Sheets

(56) References Cited

OTHER PUBLICATIONS

Leighton, G., et al., "A Grammar-based Approach for Compressing XML," TR-2005-004, Aug. 2005, 17 pages.
Leighton, G., et al., "Treechop: A Tree-based Query-able Compressor for XML," TR-2005-005, Aug. 2005, 27 pages.
Li, W., XCOMP: An XML Compression Tool, A Thesis Presented to the University of Waterloo in fulfillment of the thesis requirement for the degree of Master of Mathematics in Computer Science, Waterloo, Ontario, Canada, 2003, 86 pages.
Segoufin, L., et al., "Validating Streaming XML Documents," Symposium on Principles of Database Systems, Proceedings of the twenty-first ACM SIGMOD-SIGACT-SIGART symposium on Principles of database systems, Madison, Wisconsin, 2002, 12 pages.
Toman, V., "Syntactical Compression of XML Data," Proceedings International Conference on Advanced Information Systems Engineering, Jun. 2004, 12 pages. Retrieved from internet URL:http://caise04dc.idi.ntnu.no/CRC_CaiseDC/toman.pdf>, download date of Jul. 24, 2007.
Werner, C., et al., "WSDL-Driven SOAP Compression," International Journal of Web Services Research, 2(1), Jan.-Mar. 2005, pp. 18-35.
Cheney, J., "Compressing XML with Multiplexed Hierarchical PPM Models," IEEE Computer Society Press, Los Alamitos, CA, Mar. 27, 2001, pp. 163-172.

* cited by examiner

1

COMPRESSION METHOD FOR A DATA TRANSFER THAT IS INDEPENDENT OF COMPUTER ARCHITECTURE AND/OR DECOMPRESSION METHOD FOR A DATA RECORD

CROSS-REFERENCE TO RELATED APPLICATIONS

This application is a national stage application of Patent Cooperation Treaty (PCT) Application No. PCT/DE2006/002052, filed Nov. 21, 2006, which in turn claims priority to German Patent Application No. 10 2005 056 122.5, filed Nov. 23, 2005. These applications are assigned to the same assignee as the present application, and incorporated herein by reference in their entireties.

TECHNICAL FIELD

The invention relates to a compression method for a data transfer that is independent of computer architecture and/or a decompression method for a data record according to the features of the independent claims, particularly for simultaneous processing of data records, e.g., for applications in data transmission. The invention also relates to the implementation of data compression algorithms in digital circuits, particularly in microchips.

BACKGROUND INFORMATION

Progressive cross-linking of electronic computers has meanwhile led to the development of computer languages that are independent of the platform and that allow the exchange of information between different computer architectures. Locally installed programs (e.g., Web browsers) first translate the transmitted data into machine commands that are specific to the terminal device and so capable of being executed or interpreted. The independence from the architecture is achieved by means of following a defined structure for the transmitted data stream, whereby this generally, however, is also accompanied by an increased data volume, for example when compared to optimisations specific to the device. There is obviously, therefore, a demand for compression and decompression methods for such transmitted data streams.

BRIEF SUMMARY

One aspect provides a method for compressing of a data record, the method comprising:
providing a string automaton in a compression apparatus, wherein the string automaton represents predefined structuring rules of the data record;
inputting the data record into the string automaton, wherein the data record comprises structure tags and un-structured values and complies with the predefined structuring rules; and
processing the input data record by the string automaton to thereby produce a compressed data record, wherein the compressed data record comprises the un-structured values of the data record and control symbols representing state transitions of the string automaton's flow path caused by the structure tags of the input data record.

Another aspect provides a method for decompressing a compressed data record, the method comprising:
providing a string automaton in a decompression apparatus, wherein the string automaton represents predefined structuring rules of the data record;
inputting the compressed data record into the string automaton, wherein the compressed data record comprises control symbols for the string automaton and un-structured values, and complies with the predefined structuring rules; and
processing the input compressed data record by the string automaton to generate a decompressed data record, wherein the string automaton replaces the control symbols by structure tags to thereby generate the decompressed data record comprising structure tags and un-structured values.

Still another aspect provides a compression apparatus for compressing of a data record, the compression apparatus comprising:
circuitry implementing a string automaton representing predefined structuring rules of the data record,
wherein the circuitry implementing the string automaton is operable to process a data record input to the string automaton to thereby produce a compressed data record, wherein the input data record comprises structure tags and un-structured values and complies with the predefined structuring rules,
wherein the circuitry implementing the string automaton is further operable to add to the compressed data record the un-structured values of the data record and control symbols representing state transitions of the string automaton's flow path caused by the structure tags of the input data record.

Yet another aspect provides a decompression apparatus for decompressing a compressed data record, the decompression apparatus comprising:
circuitry implementing a string automaton representing predefined structuring rules of the data record,
wherein the circuitry implementing the string automaton is operable to process a compressed data record input to the string automaton to thereby produce a decompressed data record, wherein the input compressed data record comprises control symbols and un-structured values and complies with the predefined structuring rules, and wherein the control symbols of the compressed data record describe a flow path of the string automaton,
wherein the circuitry implementing the string automaton is further operable to replace the control symbols by structure tags to thereby generate the decompressed data record comprising structure tags and un-structured values.

BRIEF DESCRIPTION OF THE SEVERAL VIEWS OF THE DRAWINGS

One or more embodiments of the invention is explained in more detail in the following using a drawing. Shown are.

DETAILED DESCRIPTION

Figure 1:
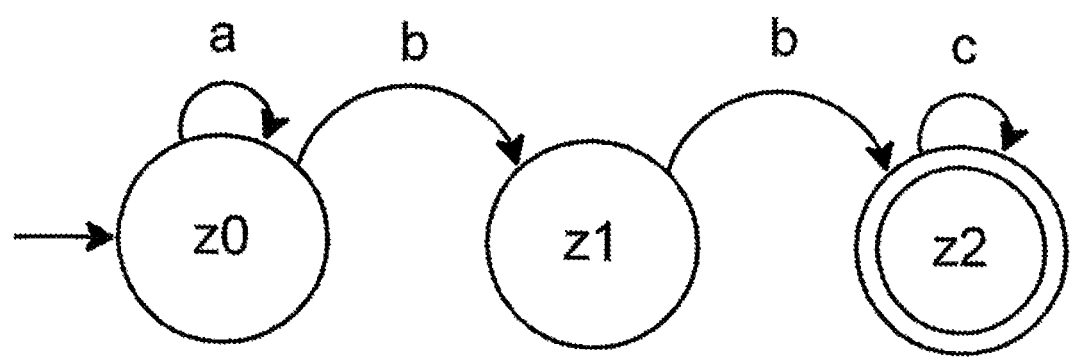
FIG. 1 a finite automaton that accepts the input data records W with the pattern $a^n bbc^m$,
FIG. 2 a finite automaton for recognizing data records for recording measurement data, and
FIG. 3 an expanded finite automaton for recognizing data records for recording measurement data, and
FIG. 4 an output data record.

In the following description, numerous specific details are given to provide a thorough understanding of embodiments. The embodiments can be practiced without one or more of the specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

The objective of any data compression technique is to convert an input data record into an output data record in such a way that the output data record is shorter than the input data record. This allows more efficient storage and transmission of the data. At the same time, the information content of the input data record must, however, be retained in the output data record (at least in essential sections) so that during a decompression process, it is possible to recover the input data record from the output data record.

There are two different classes of data compression methods: those that can be applied to any given input data (entropy encoding) and those that can be applied only to special input data (source coding). Methods for entropy encoding work with a statistical analysis of the frequencies of the symbols in the input data record. Frequent symbols in the input data record are formed into short binary tokens in the output data record and less frequent ones are formed into longer ones. In this way, it is possible to reduce the total length of the input data record. Such methods always work losslessly, i.e. it is possible exactly to reconstruct the input data record from the output data record.

Methods for source coding, on the other hand, utilize special characteristics of the input data record. For example, if it is known that a black and white digital image is stored in the input data record and that black pixels in the image matrix are encoded with 0 and white ones with 1, one can exploit the fact that typical image motifs have extensive structures. For the input data record, this means that there is a large probability that long, continuous sequences of zeros or ones will be present. This characteristic can be taken into consideration in the compression process, and run-length encoding, for example, can be used. The symbol sequence 111111111 is encoded here as 9,1 (nine times one). Some source coding methods additionally use strategies for entropy encoding. As a rule, they achieve better compression rates than plain entropy encoding methods.

There are both lossless and "lossy" methods for source coding. Lossy methods achieve even better compression rates than lossless ones, and are always used if only certain portions of the information encoded in the input data record are relevant (e.g., those portions of an audio data stream that can be perceived by the human ear).

Methods for entropy encoding have already been very extensively researched. A number of methods have become established here whose compression results lie very close to the theoretical optimum. These methods particularly include those of Shannon-Fano, Huffman, Lempel-Ziv and Lempel-Ziv-Welch.

Methods for source coding have likewise already been very thoroughly researched for several application areas, such as for audio data (for example, MP3 encoder) or image data (JPEG encoder) or moving pictures data (for example, MPEG encoder).

As mentioned at the beginning, structured or partially structured data records play a special role in communication between different computers. Such data records are set up according to fixed rules, for example, the following:

A data record consists of a 32-bit integer temperature value, followed by either a pressure value or a humidity value, likewise as a 32-bit integer. Encoding as ASCII text is done according to the following pattern:

Temperature: Value1, Pressure: Value2

Or

Temperature: Value1, Humidity: Value2

On the one hand, this data record contains fixed structuring information (Temperature:, Pressure:) and, on the other hand, variable parts with no further structure (Value1, Value2). This data record is consequently a partially structured data record. Data records without variable parts would be completely structured. Such a thorough mixing of structuring information (referred to as structural indicators in the following) and parts with no further structuring is absolutely typical in today's data records.

In the state of the art, WO 01/27754 A2 is known to describe a source coding method for compressing program source codes, and such are a possible expression for partially structured data records. This method, however, exploits the structure that is given by the respective programming language in order to produce an especially compact representation of the program source code. The method described there works with the parse tree, which is set up in the memory of a computer as the program source code is parsed. A fundamental disadvantage in this case is that the size of the parse tree grows with the length of the data record to be compressed. In long documents, this leads to a requirement for a large main memory area. Furthermore, the application area of this method is restricted to high-level computer languages.

While the known compilation of a program into machine language often leads to a shortened representation of the source code, it nevertheless cannot be seen as a suitable compressor for the object formulated here, because a compiler is fundamentally created for the rules of a previously defined programming language and for a specified computer architecture. A source code compiled under Windows cannot run on a UNIX operating system, and vice versa. Given this fact, a transfer of compiled programs between various architectures is not expedient.

Moreover, the compiled program, which is consequently executable on at least one architecture, is not necessarily shorter than the source code, so that one cannot, in principle, assume that compilation compresses the source code. A compiler, whose job is, in any case, not compression, is also not designed for decompiling compiled files. As far as decompilation is technically implemented today, it nevertheless produces only equivalent, but not identical, source code (e.g., comment lines are not restored).

Finally, it is also not known how a compiler algorithm, e.g., for a high-level language, can be completely compiled into a hardware circuit, so that direct processing of the source code without compilation by the microprocessor of the computer is not possible. Particularly when the task at hand is to compile a large number of short source codes into machine-readable form (as is common in today's server applications), the processing power required for the compilation represents a limitation.

In view of these disadvantages of the use of compilers a person skilled in the art will not solve the object of one or more embodiments of the invention using a compiler.

Further publications consider the data description language XML, which in recent years has gained acceptance as a universal means for describing hierarchically structured contents. An XML data record has two main components: markup structures (structured portions) and character data (unstructured portions). The markup structures consist of tags. Tags are identifiers in angle brackets that describe the hierarchical structure of the data record. Each identifier has a start-tag in the form <identifier> and an end-tag in the form </identifier>. The structure of a data record is formed by nesting individual tags. Either additional tag pairs or character data, or a combination of the two, can thereby be contained between a start-tag and the corresponding end-tag. Character data here are any character strings specific to an application. In principle, XML data records are permitted to contain any markup structures and any character data, as long as they satisfy the syntax rules described in the XML specification.

For a specific application case, however, typically only certain combinations are meaningful. For the application case mentioned above, for example, only the tag identifiers measured values, temperature, pressure and humidity should be allowed, in the combinations and orders described above.

Such restrictions can be defined with special grammar description languages for XML (common here are the languages DTD and XML-Schema).

Source coding methods especially for XML can therefore in turn be divided into two classes: those that can be applied to arbitrary XML documents and those that first read in a grammar description and then can be applied only to the XML documents that satisfy this grammar description. The latter achieve even better compression results.

The first group includes xmlppm, XMill, exalt, fast infoset and XMLZip. The latter is a commercial product that is, however, no longer sold. These methods separate the character data and markup areas and then apply entropy encoding methods to each area. Certain XML syntax rules are furthermore exploited during compression. In particular, the characteristic that each XML document can be represented as a tree (acyclic, connected, undirected graph) is exploited. By means of these techniques, the compression results that are achieved are distinctly better than those achieved by entropy encoding methods.

The second group includes WBXML, Millau, bim, Xebu, Xgrind and additional table-based encoding techniques. In addition to known techniques from the first group, here certain patterns (tokens) that may be in the XML document that is to be compressed are additionally extracted from the grammar description. Each token is then assigned to an unambiguous character string that is as short as possible. This assignment is stored in a table that then serves as a dictionary of abbreviations during compression. Because these methods can additionally exploit information from the grammar description for the compression process, they work even more effectively than generic XML compressors. These methods always make limited use of resources, because in this case, the compression process is essentially limited to comparing character strings in the abbreviation table and in the input data record. The compression rates achieved are, however, not optimal because of the principle itself. It is only evaluated which tokens can appear in the input data record. The information on the order of the tokens is not taken into account.

The second group likewise includes the method for XML difference coding presented in the article Werner, Christian; Buschmann, Carsten; Fischer, Stefan: *WSDL-Driven SOAP Compression. In: International Journal of Web Services Research* 2 (2005), No. 1. This method does not work with an abbreviation table. Instead, a set of skeleton data records is generated from the grammar description. These represent all possible variations of data records that satisfy this grammar description. In the framework of the compression process, the data record that is to be compressed is then compared to the best-matching skeleton data record and only deviations from it are coded. The difference coding approach is particularly powerful. It also takes into account information regarding possible sequences of input patterns. But the algorithmic effort in the case of complex grammar descriptions is very high, because the data record that is to be compressed must be compared to a multitude of skeleton data records. This approach is therefore suitable only for selected applications with simple grammar descriptions.

Current source coding methods for compressing structured or partially structured data require either a large amount of processing power and memory or do not work particularly effectively.

Most of the known source coding methods for compressing structured data records (exceptions here are WO 01/27754 A2, WBXML and the method of Millau) furthermore obligatorily assume that the compressed data must first be decompressed before they can be parsed and processed. In practice, this is often a crucial disadvantage, on the one hand, because this additional processing step results in delays, and on the other hand, because the decompressed data record must be kept in memory, which, particularly in the field of the mobile micro-computers with very limited main memory, represents a serious disadvantage.

Particularly for micro-computers, it is in any case advantageous and desirable to implement compression and decompression of transmitted data in hardware to the largest extend. The concept of the automatons from theoretical computer science can be used for this.

Such an automaton, or "state machine", is a functional group with a very simple configuration. In the simplest case, it consists of a single clocked memory element (e.g., a 16-bit register) and can store a single value (state) in this memory element at any given time. In addition to this memory element, such an automaton also has a set of rules that determines, depending on the current state, on the one hand, and the characters read from the input, on the other hand, which state should be adopted in the next clock step. Certain developments of such automatons additionally have a so-called push-down stack. Such automatons are called stack machines.

One great advantage in this case is that an automaton, unlike a compiler, does not require a microprocessor in order to be executed; it can be implemented solely on the basis of a clocked memory element (as state memory) as well as a ROM or RAM module (for the state transition rules).

In addition, in the case of such an automaton, no parse tree is built up in the memory, such as a compiler would do. An assembler compiler also does not work according to the state-based principle of such an automaton.

The fundamental advantage of automatons is two-fold:
Because of their simple structure, automatons can be implemented in a micro-chip in accordance with known methods.
Automatons (particularly string automatons, which are to be distinguished from tree automatons) for processing the data record type can be systematically designed according to known methods from almost any structure rules of a data record type (concrete example: XML).

When "implementation" of a string automaton is discussed in the following, the creation of a corresponding hardware circuit is primarily meant. Implementation in the form of software can, however, simulate hardware circuits, as is known.

Furthermore, tree automatons for processing and validating XML documents are known, such as from US 2003 0154444 A1. This automaton class was the object of a great deal of research work on processing structured data records in recent years.

Data compression using string automatons was already proposed in the article from Vojtech TOMAN: *Syntactical Compression of XML Data*. Proceedings of the 16$^{th}$ International Conference on Advanced Information Systems Engineering, 7-11 Jun. 2004, Riga, Latvia. In the case of the method described there, the grammar description is initially assumed to be unknown. At the processing start, there consequently is no information on the structure of the data record to be processed. During the processing, the algorithm "learns" the structure, and a separate string automaton is created and, if necessary, expanded, for each symbol found in the data records, whereby this string automaton describes the structure information subsequently assigned to this symbol. The state transitions of the automatons are furthermore counted to indicate how often individual structure branches are called up in such an automaton. These automatons are then accessed for processing the input data record. Compact coding of the input document is produced by means of evaluating the frequency counts of the state transitions used and using these to make a prediction which symbol will follow next.

For practical use, the method is only partially suitable, because new automaton structures must be created and updated dynamically during the processing of a data record. For implementation as a chip, this is disadvantageous, because it is not known ahead of time how many memory cells would have to be provided on the circuit. It is furthermore detrimental that the automaton structures never completely portray the rules that the data record satisfies. Even in the case of very long data records, in which the algorithm can "learn" a very great deal of information about the structure of the data record, the automatons that were created by steps do not necessarily describe the structure of the data record in full. Toman additionally constructs only such string automatons that lie in the class of the acyclic, deterministic finite automatons. These are adequate only for descriptions of very simple structure descriptions.

It is the object of one or more embodiments of the invention to specify methods for the compression and decompression of at least partially structured data records, whereby said methods additionally, preferably in a simplified manner, make it possible to encode any data records and to process compressed data records without prior decompression and that moreover are easy to implement in hardware.

The object is solved by the method with the features of the independent claim. The dependent claims indicate advantageous developments.

The proposed method for compression and/or decompression of a data record that contains structure and variable values is characterised by provision of a string automaton, which represents the previously known structuring rules of the data record in a unit that compresses the original data record, input of the data record into the string automaton, generation of a second, shorter data record by the string automaton, said record containing the variable values of the first data record and control symbols that are specific to the string automaton, said symbols representing a switch from one automaton state to a subsequent state, and transmission of the second data record to a similar string automaton, which interprets the control symbols, whereby a copy of the original data record with an identical data structure is generated.

An inventive concept lies in the introduction of control symbols in those places where the state transitions of the automaton have branching possibilities. The replacement of the structure symbols that are otherwise carried along in the uncompressed data record with the very short control symbols of the automaton is necessary for high compression efficiency. The structure rules of the processed data records being reflected in the automaton design allows for this.

Naturally, it is also possible for there to be only a decompression of a previously received data record, e.g., one received via the Internet, said data record containing control data for string automatons and variable values. In this case, it is only necessary to enter the data record in a pre-specified, known string automaton that interprets it and then produces from it an uncompressed representation of the data record and/or controls external functional groups.

It is essential for one embodiment of the invention to re-encode the compressed data record so that the compressed representation describes the flow path through the string automaton. This flow path is described thereby using suitable control symbols, which represent "branches".

In other words: The proposed compression method consists of showing a way for manufacturing a simple hardware compressor, which is simultaneously the decompressor and processor of the compressed data record. Such chip can be systematically developed and industrially manufactured for each, practically any, compression problem. Built into any computer architectures, it then allows complete transfer freedom of compressed data records.

The control symbols that are in accordance with one embodiment of the invention and that are needed for this are not present or are not processed in "normal" stack machines as they are described in the literature for standard applications.

In principle, the control symbols can be represented by a few bits. The method allows the size of typical data records to be reduced by factors between 10 and 15. These savings are primarily reached due to the fact that the structure information in a data record is already described by unambiguous state transitions in the known string automaton. A large portion of the state transitions in the string automaton consequently have only one subsequent state. Because in such a case, the state transition is already clear, this information does not have to be encoded in the output data. In other words: Such unambiguous state transitions can be encoded with 0 bits.

The entire structure information of a data record can consequently be reduced to a few bits. All tags or tokens that describe structure information are removed from the data record, because the data structure is already reflected in the automaton. In particular, no translation table has to be reserved.

The data record compressed in this way is only suitable for running through this special automaton, and so it must be known, particularly to the receiver of a compressed transmission. It contains, however, only variable values and the compactly encoded control symbols, i.e., no redundant information whatsoever. The data record can obviously also be fully processed without prior decompression.

Such automatons are furthermore simple to implement in hardware. In the design of digital circuits, automatons are standard modules and so constituents of virtually every clocked digital circuit.

A string automaton is a functional group that examines the validity of an input data record W using pre-specified states and state transitions. The example in FIG. 1 explains the basic procedure graphically. A string automaton includes states and state transitions. In the schematic depiction, these are the circles and the arrows between the circles. One state here is identified as the start state (arrow pointing to z0). One or more states are identified as end states (double circles). The transitions between the states are labelled in the form of a character string, giving the string automaton its name.

While examining an input data record W, the automaton runs through a sequence of states (flow path). The automaton processes W character by character, from left to right, and selects the state transitions with the matching labels. If there is no matching state transition or if the sequence ends in a state that is not the end state, the input word is invalid; otherwise it is valid.

For the input data record W1=aabbc, the depicted automaton would run through the sequence $z0, z0, z0, z1, z2, z2$. State $z2$ is the end state, so that W1 is a valid input.

The input data record W2=abba, on the other hand, would not be valid, because here the partial sequence $z0, z0, z1, z2$ results, and there is no transition from $z2$ with the label a. W3=aaab would also be invalid, because the resulting sequence $z0, z0, z0, z0, z1$ does not end with an end state.

There are several types of string automatons. FIG. 1 shows an example for the simplest automaton variant: a finite automaton. This type has no further memory elements (except those for the state and state transitions) and can therefore, because of the principle, process only data records with a simple structure (those that are the words of a language which is in the class of regular languages).

In addition to the finite automaton type, the use of stack machines is also particularly common. These are configured like a finite automaton, but additionally have a push-down stack (often also called LIFO memory). Reading and writing operations involving the push-down stack are controlled via two additional labels of each state transition. Each state transition consequently has three label fields:

Input character to be read
Character to be read from the pushdown stack
Characters to be written to the push-down stack Even complex structured input data records can be processed with a stack machine (those that are the words of a language which is in the class of context-free languages, cf. Schöning, Uwe: *Theoretische Informatik kurzgefaßt<A compact guide to theoretical computer science>*, $3^{rd}$ edition, Spektrum, 1997).

In principle, all string automaton types are suitable for implementing the method. Each type can, however, offer specific advantages in certain applications: finite automatons, for example, require very little memory and stack machines are particularly versatile in use, because they can recognize all context-free languages.

Producing a string automaton from structure descriptions such as regular expressions, for example, is known. In particular, it is possible to construct stack machines from XML grammar descriptions (DTD, XML-Schema document) [Segoufin L.; Vianu, V.: *Validating Streaming XML Documents*. Proceedings of the $21^{st}$ ACM SIGMOD-SIGACT-SIGART symposium on Principles of database systems, Madison, Wis., USA, 2002].

The method according to one embodiment of the invention focuses on the application of these automatons to the removal of redundant structure information from the data record and on the introduction of control symbols for controlling the automaton flow in those places where alternative state changes are possible.

Figure 2:
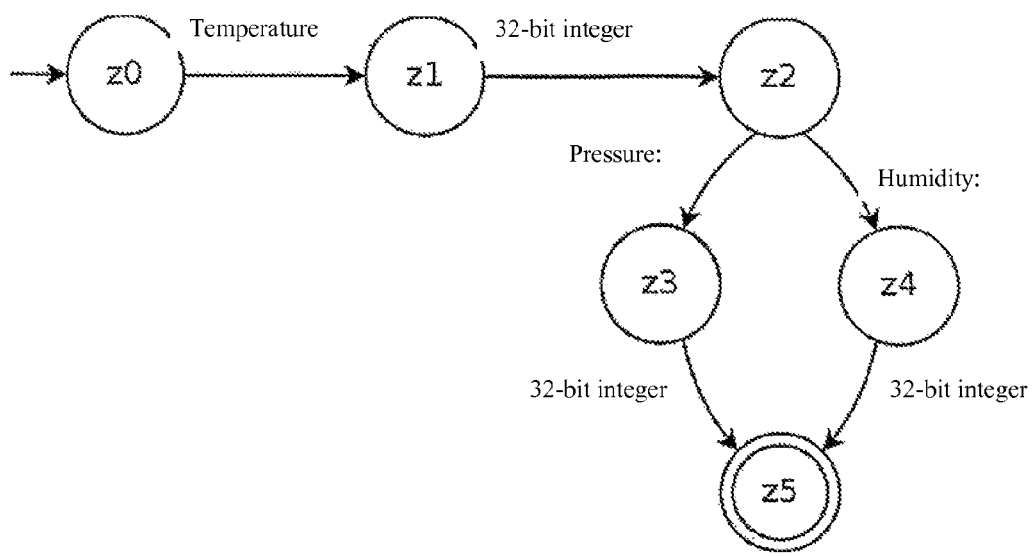

For the example mentioned at the beginning, a finite automaton, as shown in FIG. 2, can be specified that describes the structure of the input data records that are to be processed. The alternatives, namely whether a pressure value or a humidity value follows the temperature value, is described in the automaton by two possible state transitions starting from $z2$.

The automaton description can furthermore contain information about the content of non-structured areas in the input data record (Boolean, string with length 10, 16-bit integer, etc.). In the example, the state transitions from $z3$ to $z5$ and from $z4$ to $z5$ each indicate that numerical values are expected here that can be expressed as 32-bit integer numbers. This information is evaluated during the compression process, in order to find especially compact encodings for possible values. During the decompression, this altered manner of expression is reversed again. The variable values contained in a data record can be output in an altered encoded form or recognised and converted during the processing by both an encoding string automaton and an interpreting one.

In order for it to be possible to use the automaton for compression, it must first be expanded as follows.

If the automaton has states with more than one possible subsequent state, the state transitions to the subsequent states are given additional, locally unambiguous identifiers (control symbols). This produces an expanded string automaton.

Figure 3:
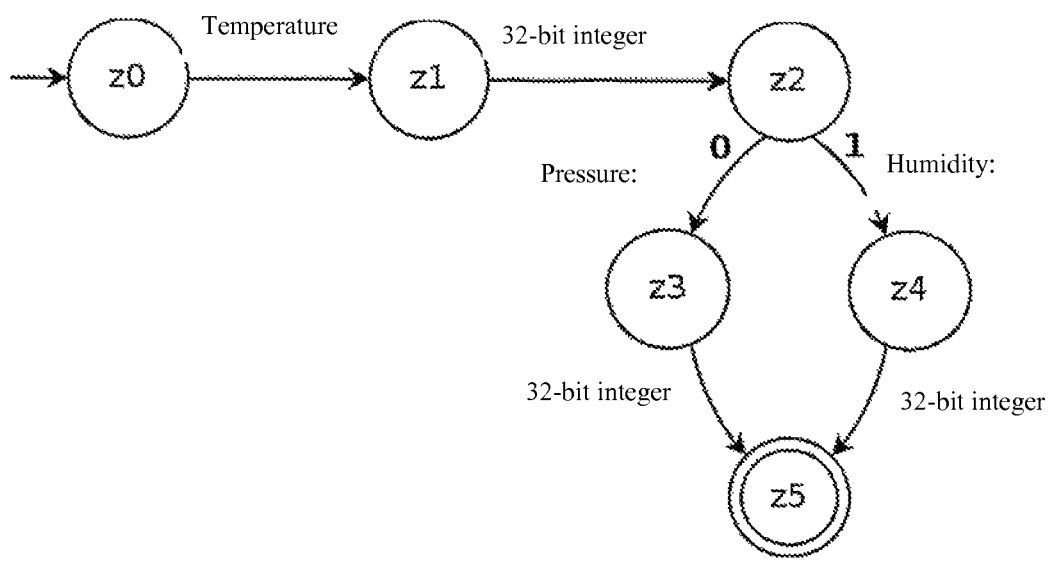

In the example, such an expansion would consequently be necessary at $z2$. There are only two subsequent states, so that consequently a single bit is sufficient for unambiguous encoding. In the example, the transition to $z3$ is marked with 0 and that to $z4$ is marked with 1. FIG. 3 shows an example for an automaton expanded in this way.

If there are more than two possible subsequent states, the bit sequence must be longer. The encoding method from Huffman is particularly suitable for producing such unambiguous codes for the state transitions. It produces minimal, unambiguous codes and can also take the probabilities of the state transitions into account. If it is known that certain state transitions are selected more frequently than others, these can be encoded with especially short bit sequences. This has a positive effect on the compression result.

The expanded string automaton processes the input data record that is to be compressed. If states that have more than one possible subsequent state flow through, the locally unambiguous identifier of the selected state transition is encoded in the output data record. If non-structured contents are read from the input during the state transitions, these are likewise encoded in the output data record.

For the example data record
.Temperature:121,Pressure:918
the following actions would be executed:

| State | Read (from input data record) | Write (in output data record) |
|---|---|---|
| z0 (start) | Temperature: (structural indicator) | (Transition is unambiguous) |
| z1 | 121 | 121 as 32-bit integer |
| z2 | , Pressure: (structural indicator) | '0' (transition to z3) |
| z3 | 918 | 918 as 32-bit integer |
| z5 (end) | — | — |

Figure 4:
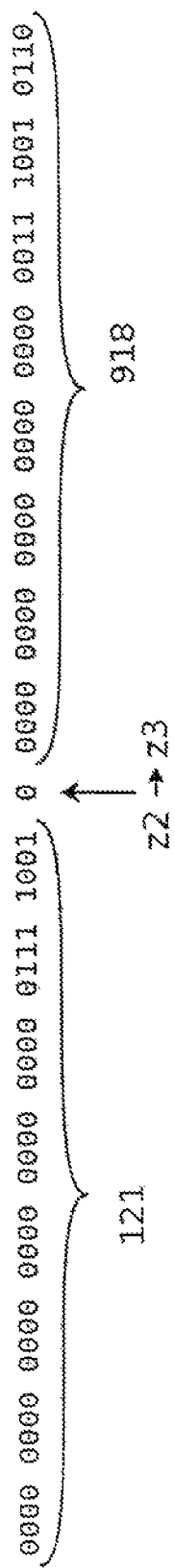

The output data record as shown in FIG. 4 consequently results.

In this data record, which is only 65 bits long, all the information that is needed for reconstructing the input data record with the help of the string automaton is encoded. The length of the uncompressed input data record in 7-bit ASCII encoding is $28 \times 7 = 192$ [bits].

The starting point for the decompression process is, in turn, the expanded string automaton used for compression. This automaton will once again run through from the start state to an end state. The automaton's flow path during the decompression is, however, controlled by the data record that is the result of the compression process. During the flow, the values with which the state transitions are labelled are written into the output data record. The values of non-structured contents here are decoded and likewise written into the output data record.

The results for the above example are:

| State | Read (from input data record) | Write (in output data record) |
|---|---|---|
| z0 (start) | (Transition is unambiguous) | Temperature: (Structural indicator) |
| z1 | 32-bit integer | 121 |
| z2 | '0' (transition to z3) | , Pressure: (structural indicator) |
| z3 | 32-bit integer | 918 |
| z5 (end) | — | — |

The example data record can consequently be exactly reconstructed.

In the case of more complex string automatons, in which the state transitions are not only controlled by the input data record, but also depend on other parameters (for example, on the top-most value in the memory of a stack machine), it can be expedient to carry out the expansion of the string automaton dynamically in the framework of the compression and decompression process, instead of ahead of time.

Example: The state z4 in a stack machine has ten possible subsequent states. During one of the static expansions of the automaton, these ten states must be encoded using a block code with $[\log_2 10]=4$ bits.

During the processing of an input data record X, the automaton now reaches z4. On the basis of the top-most entry in the push-down stack, however, only two of the ten transition states are possible. In this situation, it is also necessary to encode only these two states, because only they can be selected during the processing of the input; one bit is sufficient for this purpose.

Because, however, the state of the push-down stack changes dynamically with the processing of the input data record, such optimised encoding can only be determined dynamically, i.e., during the processing of an input data record. This leads to better compression results, but has the disadvantage that during compression and decompression, additional calculation steps must be carried out. As a result, the processing speed is somewhat slower.

Both the compression process and the decompression process are essentially based on the fact that the states of a string automaton are run through. Such automatons have an exceptionally simply structure and can be efficiently implemented in hardware or software.

In the case of a finite automaton, only a RAM memory area for holding the current state is required. The state transitions of the automaton can be stored as a table in a ROM area. The start state and end states are likewise not variable, and can therefore likewise be stored in ROM.

Even a stack machine is only a little bit more complex; there it is only necessary to provide an additional RAM memory area as the push-down stack.

One particular advantage of such automatons lies in the fact that they are very simple to implement. The implementation of a string automaton is essentially restricted to the flow through a while loop, and the necessary storage space is very limited.

Automaton structures are also common modules in chip design. The automaton structures used in this association are frequently called finite state machines or Moore machines, and correspond as far as possible to the finite automatons introduced above. For implementation of a stack machine in hardware, the automaton structure would have to be expanded by a stack, which is likewise a standard module.

In addition to these advantages in the implementation, the method also offers the possibility of combining the processes of parsing and data compression or decompression into a single processing step.

The control of the automaton flow can be handled directly from another software component via a programming interface (API). If the implementation is carried out in hardware, the automaton flow could be controlled from other modules or functional groups via control lines. This has the advantage that absolutely no uncompressed representation of the data to be compressed must be reserved in the memory of the data-compressing device. This representation form is possibly very large and unnecessarily consumes the storage capacity of the data-compressing device. On a machine producing data records of measurements, it would be, for example, possible to not produce the uncompressed representation of the data record with the measured values at all. When the measured values are recorded, the flow of the string automaton is directly controlled by this technical process. The compression result, however, corresponds to one in which there had been an uncompressed representation of the data record, so that a receiver of the compressed data record can decompress and interpret or further process the measurement data in the absolutely normal way.

The method indicated above also allows for the string automaton additionally to arrange the control of external functional groups during its run. For example, it would be possible that, in the framework of the decompression, the uncompressed representation of the data record is not to be recovered at all. Possibly an external functional group or module (for example, an external software component, production system or arithmetic-logic unit) should alternatively or additionally be controlled depending on the values read from the data record. Many technical processes can namely be portrayed directly on an automaton model as is proposed by an embodiment of the invention The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A method usable for compressing data records that comply with predefined structuring rules, the method comprising:
inputting a data record into a string automaton of a compression apparatus, wherein the data record comprises structure tags and unstructured values and complies with said predefined structuring rules, and wherein the string automaton represents predefined structuring rules of the data record as state transitions of the string automaton; and compressing the input data record by the string automaton to thereby produce a compressed data record, wherein the compressed data record comprises the unstructured values of the data record and control symbols representing state transitions of the string automaton's flow path caused by the structure tags of the input data record, with bit representations of the control symbols based on at least one of probabilities and frequencies of the state transitions encoded by the control symbols, and wherein compressing the input data record comprises:

replacing structure tags of the input data record by control symbols, wherein a respective structure tag is replaced by a control symbol to denote the state transition of the string automaton, in case the state transition from a current state to a subsequent state of the string automaton caused by the respective structure tag is ambiguous, and removing structure tags of the input data record, wherein a respective structure tag of the input data record is removed, in case the state transition from the current state to the subsequent state of the string automaton caused by the respective structure tag is unambiguous.

2. The method according to claim 1, further comprising transmitting the compressed data record to a decompression apparatus.

3. The method according to claim 1, wherein the data record is an eXtensible Markup Language (XML) document.

4. The method according to claim 1, wherein processing the input data record by the string automaton comprises controlling external functional groups or modules.

5. The method according to claim 1, wherein the unstructured values of the data record are output by the string automaton in an at least partially altered, encoded form or are recognized and converted by said string automaton.

6. The method according to claim 1, further comprising storing additional coding rules in the string automaton relating to state transitions.

7. The method according to claim 1, further comprising determining bit representations of the control symbols for coding state transitions of the string automaton based on dynamically changing memory content.

8. The method according to claim 1, and the method comprises determining whether a state transition of from a current state to a subsequent state caused by the respective structure tag is ambiguous or unambiguous taking into account whether the current state allows for transitions to plural subsequent states.

9. The method according to claim 8, wherein the string automaton is implemented by circuitry comprising a push-down stack and determining whether a state transition of from a current state to a subsequent state caused by the respective structure tag is ambiguous or unambiguous is further taking into account the state of the push-down stack.

10. A method for decompressing a compressed data record, the method comprising:

inputting the compressed data record into a string automaton of a decompression apparatus, wherein the compressed data record comprises unstructured values of the uncompressed data record and control symbols representing state transitions of the string automaton's flow path caused by the structure tags of the uncompressed data record upon compression, with bit representations of the control symbols based on at least one of probabilities and frequencies of the state transitions encoded by the control symbols, and wherein the string automaton represents predefined structuring rules of the data record as state transitions of the string automaton; and decompressing, by the string automaton, the input compressed data record to generate the uncompressed data record comprising structure tags and unstructured values, wherein control symbols of the compressed data record and unambiguous state transitions of the string automaton's flow path caused by the input compressed data record are replaced by structure tags to thereby generate the uncompressed data record.

11. The method according to claim 10, wherein, in addition or alternatively to generating the decompressed data record, processing the input compressed data record comprises controlling functional groups or modules by the string automaton.

12. The method according to claim 10, further comprising storing additional coding rules for state transitions of the string automaton.

13. The method according to claim 10, further comprising determining bit representations of the control symbols for coding state transitions of the string automaton based on dynamically changing memory content.

14. The method according to claim 10, wherein the string automaton is implemented by circuitry comprising a push-down stack and replacing control symbols of the compressed data record and unambiguous state transitions of the string automaton's flow path caused by the input compressed data record by structure tags is taking into account the state of the push-down stack.

15. A compression apparatus for compressing of a data record, the compression apparatus comprising:

circuitry implementing a string automaton representing predefined structuring rules of the data record as state transitions of the string automaton, wherein the circuitry implementing the string automaton is operable to compress a data record input to the string automaton to thereby produce a compressed data record, wherein the input data record comprises structure tags and unstructured values and complies with the predefined structuring rules, wherein the circuitry implementing the string automaton is further operable to replace structure tags of the input data record by control symbols, wherein a respective structure tag is replaced by a control symbol to denote the state transition of the string automaton with bit representations of the control symbols based on at least one of probabilities and frequencies of the state transitions encoded by the control symbols, in case the state transition from a current state to a subsequent state of the string automaton caused by the respective structure tag is ambiguous, and remove structure tags of the input data record, wherein a respective structure tag of the input data record is removed in case the state transition from the current state to the subsequent state caused by the respective structure tag is unambiguous.

16. The compression apparatus according to claim 15, further comprising a push-down stack and wherein the circuitry implements a state machine.

17. A micro-chip comprising a compression apparatus according to claim 15.

18. The compression apparatus according to claim 15, wherein the circuitry implementing the string automaton is comprising a push-down stack, and is further operable to determine whether a state transition of from a current state to a subsequent state caused by the respective structure tag is ambiguous or unambiguous taking into account whether the current state allows for transitions to plural subsequent.

19. The compression apparatus according to claim 18, wherein the circuitry implementing is further operable to determine whether a state transition of from a current state, allowing for transitions to plural subsequent states, to a subsequent state caused by the respective structure tag is ambiguous or unambiguous taking into account the state of the push-down stack.

20. A decompression apparatus for decompressing a compressed data record, the decompression apparatus comprising:

circuitry implementing a string automaton representing predefined structuring rules of the data record as state transitions of the string automaton, wherein the circuitry implementing the string automaton is operable to decompress a compressed data record input to the string automaton to thereby produce an uncompressed data record, wherein the input compressed data record comprises unstructured values and control symbols representing state transitions of the string automaton's flow path caused by the structure tags of the uncompressed data record upon compression with bit representations of the control symbols based on at least one of probabilities and frequencies of the state transitions encoded by the control symbols, wherein the circuitry implementing the string automaton is further operable to replace control symbols of the compressed data record and unambiguous state transitions of the string automaton's flow path caused by the input compressed data record by structure tags to thereby generate the uncompressed data record.

21. The decompression apparatus according to claim 20, wherein the circuitry implementing the string automaton, in addition or alternatively to generating the decompressed data record, is operable to control functional groups or modules by the string automaton.

22. The decompression apparatus according to claim 20, further comprising a push-down stack and wherein the circuitry implements a state machine.

23. A micro-chip comprising a decompression apparatus according to claim 20.

24. The decompression apparatus according to claim 20, wherein the circuitry implementing the string automaton is comprising a push-down stack, and the circuitry implementing the string automaton is further operable to replace control symbols of the compressed data record and unambiguous state transitions of the string automaton's flow path caused by the input compressed data record by structure tags taking into account the state of the push-down stack.

* * * * *